United States Patent
Dai

(10) Patent No.: US 10,784,322 B2
(45) Date of Patent: Sep. 22, 2020

(54) ARRAY SUBSTRATE, MANUFACTURING METHOD, AND DISPLAY DEVICE

(71) Applicant: BOE TECHNOLOGY GROUP CO., LTD., Beijing (CN)

(72) Inventor: Qing Dai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/992,794

(22) Filed: May 30, 2018

(65) Prior Publication Data
US 2019/0181196 A1  Jun. 13, 2019

(30) Foreign Application Priority Data

Dec. 11, 2017 (CN) .......................... 2017 1 1316469

(51) Int. Cl.
- *H01L 27/32* (2006.01)
- *H01L 51/00* (2006.01)
- *H01L 51/50* (2006.01)

(52) U.S. Cl.
CPC ...... *H01L 27/3246* (2013.01); *H01L 27/3283* (2013.01); *H01L 51/0005* (2013.01); *H01L 51/0012* (2013.01); *H01L 51/5012* (2013.01)

(58) Field of Classification Search
CPC ............. H01L 27/3246; H01L 51/0005; H01L 27/3283; H01L 51/5012
See application file for complete search history.

(56) References Cited

U.S. PATENT DOCUMENTS

| 2005/0112341 A1* | 5/2005 | Ito ........................ H01L 27/3246 |
| | | 428/209 |
| 2005/0116632 A1* | 6/2005 | Funamoto ........... H01L 27/3246 |
| | | 313/506 |
| 2011/0108859 A1 | 5/2011 | Oosako |

FOREIGN PATENT DOCUMENTS

| CN | 1622706 A | 6/2005 |
| CN | 102132630 A | 7/2011 |
| CN | 107425045 A | 12/2017 |
| JP | 2007-103032 A | 4/2007 |

OTHER PUBLICATIONS

First Office Action for CN Appl. No. 201711316469.6, dated Nov. 28, 2019.
Second Office Action for CN Patent Application No. 201711316469.6 dated May 15, 2020.

* cited by examiner

*Primary Examiner* — Julia Slutsker
(74) *Attorney, Agent, or Firm* — Dinsmore & Shohl LLP

(57) ABSTRACT

Embodiments of the present disclosure provide an array substrate, a manufacturing method, and a display device. The array substrate comprises: a pixel define layer located on a base substrate, the pixel define layer having a hollow for defining a sub-pixel light emitting area, and a light emitting functional layer located in the hollow, wherein, the pixel define layer has protrusion structures on one or more sides facing the hollow.

9 Claims, 5 Drawing Sheets

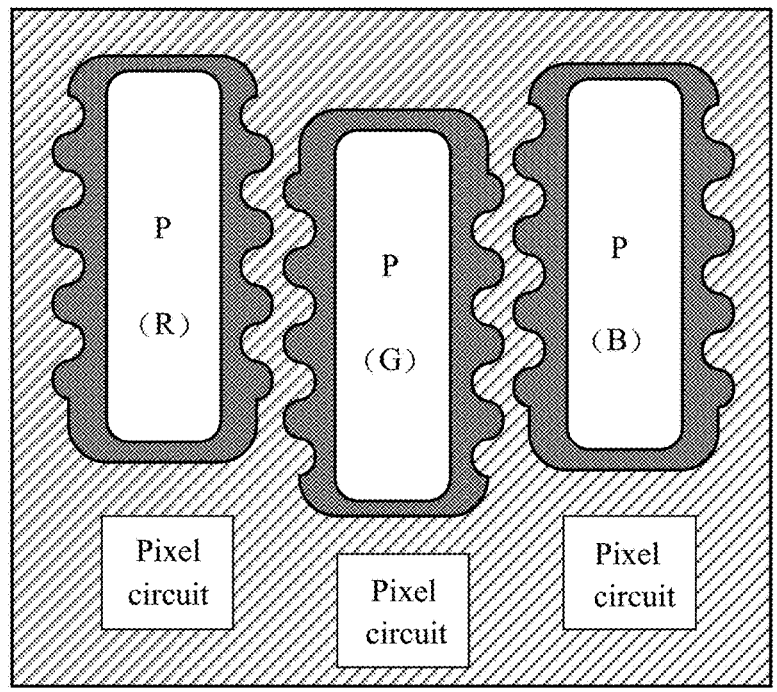

FIG. 9

| Forming a define thin film layer on a base substrate, forming a hollow at a position of the define thin film layer corresponding to a sub-pixel light emitting area through a patterning process, and forming protrusion structures on one or more sides of the define thin film layer facing the hollow, to form a pixel define layer of the array substrate | S101 |

| Forming, by inkjet printing, a light emitting functional layer within the hollow and on the base substrate on which the pixel define layer is formed | S102 |

FIG. 10

ARRAY SUBSTRATE, MANUFACTURING METHOD, AND DISPLAY DEVICE

CROSS-REFERENCE TO RELATED APPLICATIONS

The present application claims priority to Chinese Patent Application No. 201711316469.6 that was filed on Dec. 11, 2017, the disclosure of which is hereby incorporated by reference in its entirety.

TECHNICAL FIELD

The present application relates to an array substrate, a manufacturing method, and a display device.

BACKGROUND

Organic Light Emitting Diode (OLED) displays have been widely used in various electronic devices including electronic products such as computers, mobile phones, etc., because of their advantages such as self-luminescence, light weight, low power consumption, high contrast, high color gamut, and flexible display.

SUMMARY

An embodiment of the present disclosure provide an array substrate comprising a pixel define layer on a base substrate, the pixel define layer having a hollow for defining a sub-pixel light emitting area, and a light emitting functional layer located in the hollow, wherein, the pixel define layer has protrusion structures on one or more sides facing the hollow.

In some embodiments, the pixel define layer includes stacked first pixel define layer and second pixel define layer, and the second pixel define layer being located on a side of the first pixel define layer facing away from the base substrate; the hollow of the pixel define layer includes a first hollow located in the first pixel define layer and a second hollow located in the second pixel define layer; and the second hollow exposes a portion of the first pixel define layer that is around an edge of the first hollow.

In some embodiments, the first hollow and the second hollow both have two opposite long sides and two opposite short sides.

In some embodiments, the first pixel define layer has lyophilicity, a first surface of the second pixel define layer that faces away from the base substrate has lyophobicity, and a second surface of the second pixel define layer that extends from the first surface toward the base substrate has lyophilicity.

In some embodiments, the protrusion structures are located on one or more sides of the second pixel define layer facing the second hollow.

In some embodiments, the protrusion structures are located on one or more sides of the second pixel define layer facing at least a set of opposite sides of the second hollow.

In some embodiments, the protrusion structures are disposed opposite to each other.

In some embodiments, the one or more sides of the pixel define layer having the protrusion structure are polygonal surfaces or arc-shaped surfaces.

In some embodiments, the light emitting functional layer is formed by inkjet printing.

An embodiment of the present disclosure further provides a display device including the aforementioned array substrate.

An embodiment of the present disclosure also provides a method for manufacturing an array substrate, which comprises: forming a define thin film layer on a base substrate, forming a hollow at a position of the define thin film layer corresponding to a sub-pixel light emitting area through a patterning process, and forming protrusion structures on one or more sides of the define thin film layer facing the hollow, to form a pixel define layer of the array substrate; and forming, by inkjet printing, a light emitting functional layer within the hollow and on the base substrate on which the pixel define layer is formed.

In some embodiments, forming a define thin film layer on the base substrate, forming a hollow at a position of the define thin film layer corresponding to the sub-pixel light emitting area by a patterning process, and forming protrusion structures on one or more sides of the define thin film layer facing the hollow include: forming a first define thin film layer and a second define thin film layer sequentially on the base substrate, and forming a first hollow and a second hollow at positions of the first define thin film layer and the second define thin film layer corresponding to the sub-pixel light emitting region respectively through a patterning process, and forming the protrusion structures on one or more sides of the second define thin film layer facing the second hollow; wherein, the second hollow exposes a portion of the first define thin film layer that is around an edge of the first hollow.

BRIEF DESCRIPTION OF THE DRAWINGS

In order to more clearly illustrate the embodiments or technical solutions in related technologies of the present disclosure, a brief introduction will be given below for the drawings required to be used in the description of the embodiments or technical solutions in related technologies. It is obvious that, the drawings illustrated as follows are merely some of the embodiments of the present disclosure. For an ordinary technician in the art, he or she may also acquire other drawings according to such drawings on the premise that no inventive effort is involved.

FIG. 1b is a sectional schematic diagram of line O-O' of FIG. 1a;

FIG. 9 is a plan schematic diagram of a pixel define layer in an array substrate provided by one or more embodiments of the present disclosure;

FIG. 10 is a flow chart of a manufacturing method of an array substrate provided by one or more embodiments of the present disclosure.

DETAILED DESCRIPTION

The technical solutions in the embodiments of the present disclosure will be clearly and completely described below with reference to the accompanying drawings in the embodiments of the present disclosure. Obviously, the described embodiments are only a part of the embodiments of the present disclosure instead of all of them. All other examples that are obtainable to those skilled in the art based on the examples of the present disclosure without any creative effort are included in the protection scope of the present disclosure.

An array substrate in a display device generally includes a pixel define layer (PDL) 200 disposed on a base substrate 100 and defining a sub-pixel light emitting area P. A plurality of sub-pixels constitute one pixel in a pixel array of a display panel. For example, three sub-pixels emitting red light (R), green light (G), and blue light (B) respectively constitute one pixel. The pixel defining layer 200 has a hollow (which may also be referred to as an opening) at a position of the sub-pixel light emitting area P, and a light emitting functional layer is provided in the hollow.

Figure 1A:
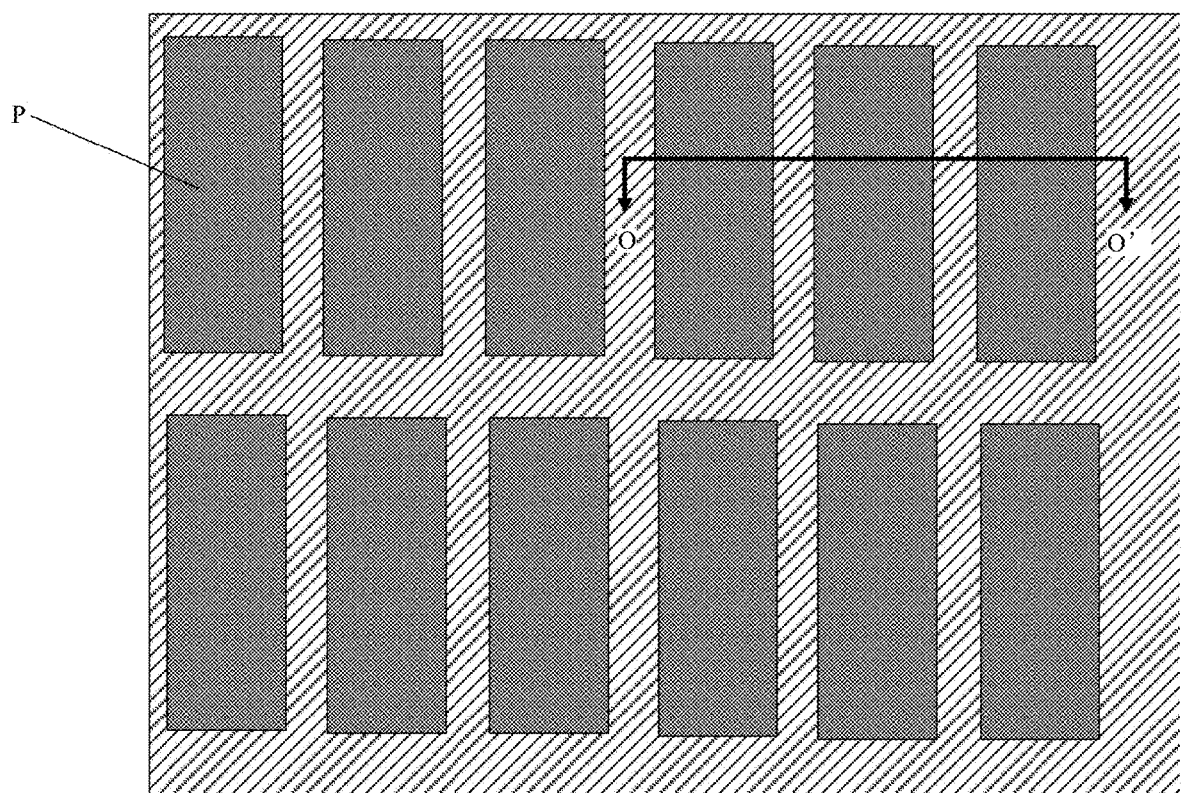
FIG. 1a is a structural schematic diagram of an array substrate related to the present disclosure.
Figure 1B:
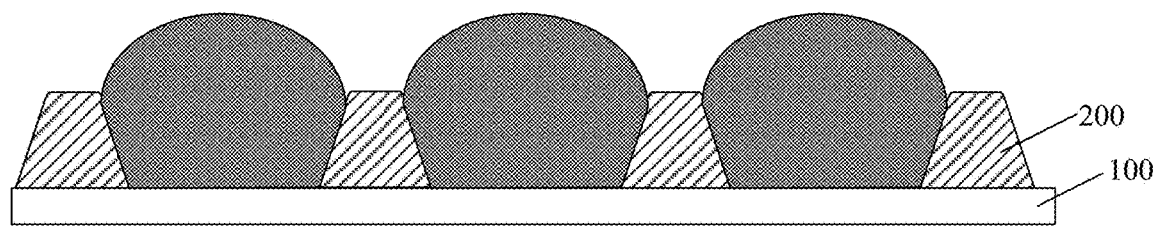

As shown in FIGS. 1a and 1b (sectional schematic diagrams along line O-O' of FIG. 1a), an array substrate is generally fabricated by the following steps: on the base substrate 100 provided with a pixel define layer 200, ink is printed to the corresponding sub-pixel light emitting area P in the pixel define layer 200 by an inkjet printing method, and then an excess solvent is removed through a subsequent drying process to form an organic light emitting functional layer.

Figure 2:
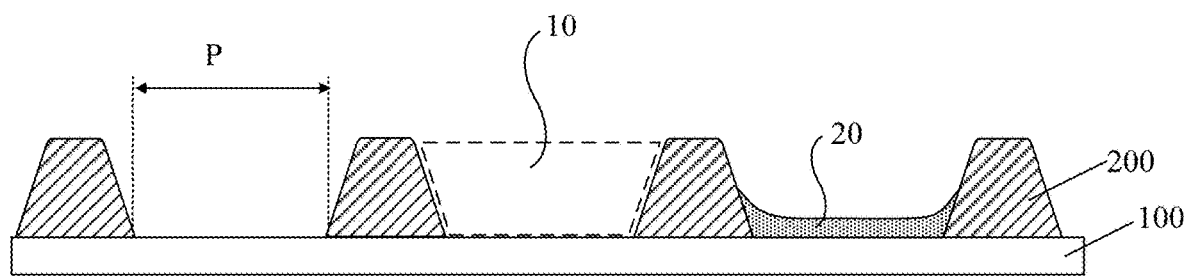
FIG. 2 is a structural schematic diagram of the cross section of a pixel define layer in an array substrate provided by one or more embodiments of the present disclosure.

An embodiment of the present disclosure provides an array substrate including a pixel define layer 200 disposed on a base substrate 100. The pixel define layer 200 has a hollow 10 for defining a sub-pixel light emitting area P. The array substrate further comprises a light-emitting functional layer 20 located within the hollow 10. Of course, in FIG. 2, only one light emitting functional layer 20 within one hollow is schematically drawn. It should be understood that a light emitting functional layer is disposed in each hollow in an actual array substrate.

Figure 3:
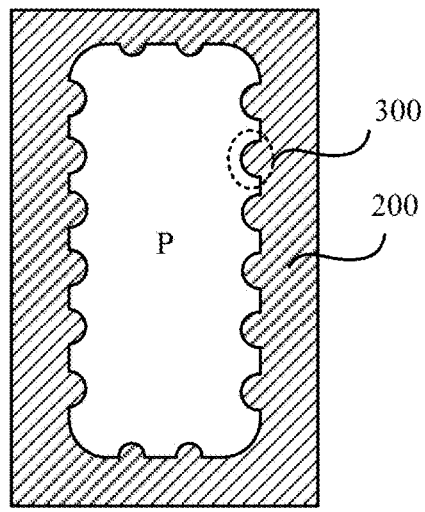
FIG. 3 is a plan schematic diagram of a pixel define layer in an array substrate provided by one or more embodiments of the present disclosure.

In addition, as shown in FIG. 3 (a plan schematic diagram of an array substrate), the pixel define layer 200 has protrusion structures 300 on a side facing the hollow 10.

Generally, as shown in FIG. 3, the sub-pixel light emitting area P has an approximately rectangular structure with a set of oppositely arranged long sides and a set of oppositely arranged short sides. Based on this, the hollow 10 in the pixel define layer 200 also has an approximately rectangular structure.

In the present disclosure, by providing protrusion structures on a side of the pixel define layer facing the hollow (i.e., a sub-pixel light emitting area), such that when a light emitting functional layer is formed in the hollow by using an inkjet printing process, the protrusion structures on the side facing the hollow is able to adjust a surface tension of the ink printed in the hollow area. That is, according to the actual requirements, the surface tension of the ink in the sub-pixel light emitting area can be redistributed by providing a protrusion structure on the side facing the hollow, so that a distribution of stress of solute migrating during a thin film drying process within the sub-pixel light emitting area can be adjusted. Therefore, it is possible to reduce a difference of a surface tension distribution and a migration distance of the ink along the long side and the short side in the sub-pixel light emitting area. Then, a uniformity of the formed film of the organic light emitting film layer can be improved by a reasonably optimized drying process.

In addition, it should be noted that the above-mentioned light emitting functional layer may be an organic electroluminescent layer in an organic electroluminescent diode, or a light emitting layer in a quantum dot, which is not limited in the present disclosure as long as the light emitting functional layer is formed by inkjet printing. In addition, the light emitting functional layer has generally a multi-layer structure, and the case where one or more layers of the multi-layer structure are formed by inkjet printing is applicable to the solution of the present disclosure.

In an embodiment where the light emitting functional layer is an OLED layer, the array substrate is an OLED array substrate. For the present disclosure, the OLED array substrate may be a top emission type or a bottom emission type. Of course, it may also be a dual emission type, which is not specifically limited in the present disclosure. For the OLED array substrate, it should also be understood that electrodes are generally provided on both sides of the light emitting functional layer to drive it to emit light, which are omitted in all the accompanying drawings and are not shown.

Figure 4:
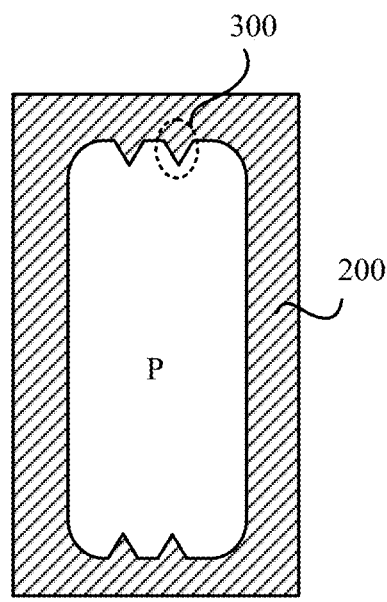
FIG. 4 is a plan schematic diagram of a pixel define layer in an array substrate provided by one or more embodiments of the present disclosure.

In addition, there are protrusion structures on a side of the above-mentioned pixel define layer facing the hollow, and the protrusion structure 300 may be a circular protrusion as shown in FIG. 3, or may be triangular protrusions as shown in FIG. 4. The protrusion structure 300 may also be a protrusion of other shapes. In the present disclosure, the specific shape and size of the protrusion structure are not limited. In one or more embodiments, the protrusion structures with one or more shapes may be disposed on a side of the pixel define layer facing a hollow.

Figure 5:
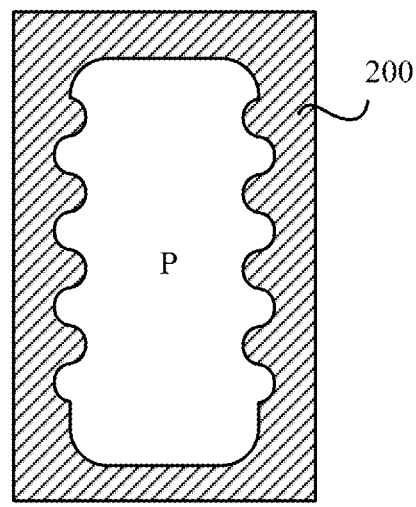
FIG. 5 is a plan schematic diagram of a pixel define layer in an array substrate provided by one or more embodiments of the present disclosure.
Figure 6:
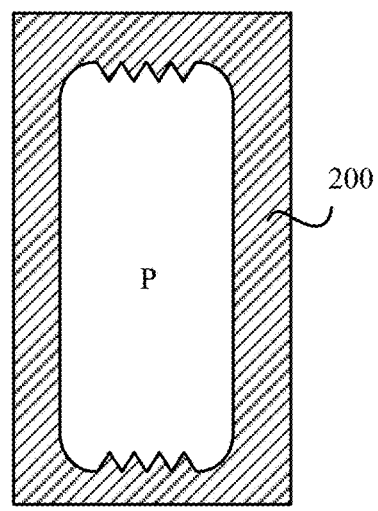
FIG. 6 is a plan schematic diagram of a pixel define layer in an array substrate provided by one or more embodiments of the present disclosure.

In addition, in one or more embodiments, the side of the pixel define layer having protrusion structures may be provided as an arc-shaped surface (for example, a sinusoidal curved surface) shown in FIG. 5 or a polygonal surface shown in FIG. 6. In one or more embodiments, some of the sides are arc-shaped surfaces, and some of the sides are polygonal surfaces. In practice, the settings may be selected as required, which is not limited in the present disclosure. In the following embodiments, the present disclosure is further described by taking the side of the pixel define layer having protrusion structures with an arc-shaped surface as an example.

FIGS. 3 to 6 illustrate an arrangement of the protrusion structure 300 only by taking one sub-pixel light emitting area P in the pixel define layer as an example. It should be understood that a plurality of sub-pixel light emitting areas P arranged in a matrix are generally provided on the array substrate, and sides at different positions in the pixel define layer facing a plurality of sub-pixel light emitting areas P (hollow 10) can be provided with protrusion structures according to actual needs. For example, more protrusion structures may be disposed on the side of the sub-pixel light emitting area P located in a middle region of the array substrate, and less protrusion structures or no protrusion structure may be disposed on the side of the sub-pixel light emitting area P in the peripheral region of the array substrate. The present disclosure is not specifically limited thereto, and a protrusion structure may be selectively set according to specific requirements in practice.

Based on this, the specific setting of the above-mentioned pixel define layer will be further described below.

Figure 7:
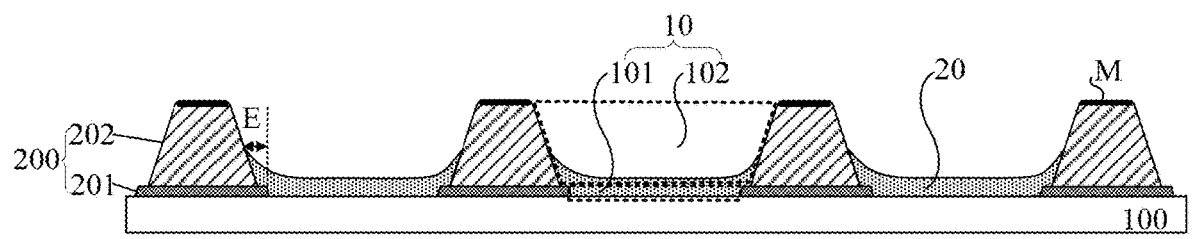
FIG. 7 is a sectional schematic diagram of a pixel define layer in an array substrate provided by one or more embodiments of the present disclosure.
Figure 8:
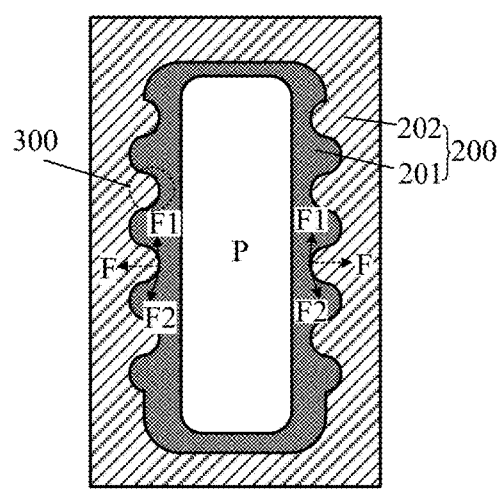
FIG. 8 is a plan schematic diagram of a pixel define layer in an array substrate provided by one or more embodiments of the present disclosure.

As shown in FIG. 7, in one or more embodiments of the present disclosure, the pixel define layer 200 includes a first pixel define layer 201 and a second pixel define layer 202 arranged in a stack, and the second pixel define layer 202 is located on a side of the first pixel define layer 201 facing away from the base substrate 100. The hollow 10 on the pixel defining layer 200 includes a first hollow 101 (also referred to as a first opening) on the first pixel define layer 201 and a second hollow 102 (also referred to as a second opening) on the second pixel define layer 202. As shown in FIG. 7 and FIG. 8, the second hollow 102 on the second pixel define layer 202 exposes a portion of the first pixel define layer 201 that is around an edge of the first hollow 101.

In the case where the hollow 10 has an approximately rectangular structure as described above, the first hollow 101 and the second hollow 102 also have an approximately rectangular structure, have oppositely set two long sides and oppositely set two short sides, and are co-centered. The first hollow 101 in the first pixel define layer 201 generally has a rounded rectangle shape. The second pixel define layer 202 may also be referred to as a bank layer for accommodating fluid ink. In practice, a thickness of the second pixel define layer 202 is much larger than a thickness of the first pixel define layer 201, and the thickness can generally be up to 1 μm to 2 μm.

Further, in order to prevent the ink forming the light emitting functional layer from interflowing and cross-coloring between the adjacent sub-pixel light emitting areas, and meanwhile to ensure that a part of ink droplets slightly deviated from the falling trajectory can also fall into the corresponding sub-pixel light emitting areas, in one or more embodiments of the present disclosure, referring to FIG. 7, it may be configured that the first pixel define layer 201 has lyophilicity, a first surface M of the side of the second pixel define layer 202 facing away from the base substrate 100 has lyophobicity, and a second surface of the second pixel define layer 202 extending from the first surface M toward the base substrate 100 side has lyophilicity.

Further, as shown in FIG. 8, the protrusion structures 300 are disposed on sides of the second pixel define layer 202 facing the second hollow so as to effectively adjust a surface tension distribution of the ink printed in the hollow area.

The following further describes the formation process of the light emitting functional layer and the corresponding effects in combination with the above-mentioned arrangement manner of the pixel define layer.

In the production process, ink of the light emitting functional layer is printed in the hollow in a manner of inkjet printing. At the end of printing, the amount of ink is large, and the height of the ink droplets is much bigger than that of the bank (the second pixel define layer) (referring to FIG. 1b). With the subsequent drying process, the solvent in the ink droplets continuously evaporates and the amount of ink decreases. However, a contact interface between the ink droplets and the bank generally remains unchanged due to pin point caused by a coffee ring effect. In one or more embodiments, as the amount of ink decreases, the contact interface between the ink droplets and the bank remains fixed at a boundary between the lyophobic and lyophilic interfaces of the bank. Eventually, there is a severe edge climbing phenomenon in a morphology of the resulting dried thin film (a light emitting functional layer), i.e., the edge is thickened. Specifically, a position of a contact edge E between the light emitting functional layer 20 and the second pixel define layer 202 shown in FIG. 7 can be referred to.

Therefore, a thickness of the light emitting functional layer at an edge portion is larger than that in the middle area. As the arrangement described above, in the present disclosure, by setting the second hollow 102 on the second pixel define layer 202 to expose a portion of the first pixel define layer 201 around an edge of the first hollow 101, a position of the light emitting functional layer 20 at the edge will cover the portion of the first pixel define layer 101 around an edge of the first hollow. It should be understood that the first pixel define layer 201 is an insulating layer. Therefore, referring to FIG. 7, when the ink of the light emitting functional layer is printed in the hollow, the portion of the first pixel define layer 201 around an edge of the first hollow 101 can isolate the light emitting functional layer at the edge position from the base substrate 100 such that the thicker film layer at the edge position does not emit light, thereby reducing a phenomenon of uneven light emission from the light emitting functional layer.

It should be understood herein that in the above-mentioned arrangement, the sub-pixel light emitting area in the array substrate is actually an area where the first hollow is located, that is, the actual sub-pixel light emitting area is defined by the first pixel define layer.

In addition, the following further explains related content of improving the distribution of surface tension of the ink in the sub-pixel light emitting area by the protrusion structure so as to improve film forming uniformity of the organic light emitting film layer.

In the related art of the present disclosure, the sub-pixel light emitting area is generally rectangular (including a set of long sides and a set of short sides), that is, the organic light emitting film formed in the hollow on the pixel define layer is also rectangular. In this way, when the ink of the light emitting functional layer is printed in the hollow in the form of inkjet printing, there are gradients in the surface tension of different sections (long and short sides) inside the droplets in the hollow due to the Marangoni effect during the subsequent drying process, which results in a difference in the movement speed of the solute, and in turn leads to that the thickness of the film layer at different positions of the light emitting functional layer after drying is not uniform.

Specifically, there is a large difference in the sizes of the long and short sides of the hollow (determined by the rectangular shape of the sub-pixel), so that in the same drying process there is a large difference in surface tensions of the ink droplets located in the hollow along the long side and along the short side. Further, during an evaporation process of the solvent in the ink droplets, the migration distances and the migration speeds of the solute along the long side and along the short side are different, resulting in an uneven thickness of the light emitting functional layer along the long side and along the short side after drying, and its section is generally U-shaped (the middle is thin and both sides are thick) or W-shaped (the middle and both sides are thick and the areas between the middle and both sides are thin). In the related art, although it is possible to adjust the drying process, it is impossible to simultaneously ensure that the film thicknesses of the light emitting functional layer along the long side and the short side achieve uniformity at the same time. Generally speaking, the thickness distribution of the light emitting functional layer is affected by the shape of the hollow, the surface tension of the ink droplets, the migration distances and the migration speeds of the solute, the material of the ink and the drying process and so on.

Based on the above consideration, referring to FIG. 8 schematically, in an embodiment of the present disclosure, by disposing an arc-shaped surface having protrusion structures on sides of the second pixel define layer 202 facing the second hollow 102, a resultant force of the surface tensions of the ink droplets at the protrusion structure points to a side away from the sub-pixel light emitting area P. For example, a resultant force F of surface tensions F1 and F2 is shown in FIG. 8. It is only a schematic illustration, and in practice, the surface tensions of the ink droplets at the protrusion structure include not only F1 and F2. In this way, by providing protrusion structures on sides of the second pixel define layer facing the long side and/or short side of the second hollow based on the actually requirement, distribution of the surface tensions of the ink droplets can be adjusted to achieve a uniform thickness everywhere in the sub-pixel area under a reasonably optimized drying process, so as to improve uniformity of the film thickness of the light emitting functional layer along the long side and the short side.

Based on this, in order to further effectively adjust the surface tension of the ink droplets, in one or more embodiments of the present disclosure, as shown in FIG. 8, the protrusion structures 300 are located on sides of the second pixel define layer 202 facing at least a set of opposite sides of the second hollow 102, whereby the distribution of the surface tension of the ink droplets can be adjusted by protrusion structures on two opposite sides together.

FIG. 8 shows that the protrusion structures 300 are located on sides of the second pixel define layer 202 facing a set of long sides of the second hollow 102. In one or more embodiments of the present disclosure, the protrusion structures 300 are located on sides of the second pixel define layer 202 facing a set of short sides of the second hollow 102. In one or more embodiments of the present disclosure, protrusion structures 300 are disposed on the second pixel define layer 202 at both the set of long sides and the set of short sides of the second hollow 102. In this case, the shape and size of the protrusion structures 300 provided at the set of long sides may be inconsistent with the shape and size of the protrusion structures 300 provided at the set of short sides.

Further, in one or more embodiments of the present disclosure, as shown in FIG. 8, the protrusion structures 300 located on sides of the second pixel define layer 202 facing a set of opposite sides (a set of long sides or a set of short sides) of the second hollow 102 are disposed opposite to each other. Therefore, under the action of the protrusion structures 300 disposed opposite to each other, ink droplets in the hollow can be subjected to a greater outward surface tension (facing away from the interior of the pixel light emitting area), so as to more effectively adjust the distribution of the surface tension of the ink droplets. That is, the second pixel define layer can provide a tendency of effectively pulling fluid towards an edge at the positions where the protrusion structures are disposed opposite to each other, thereby increasing a flatness of the thin film in the direction of the opposite sides.

Schematically, as shown in FIG. 8, arc-shaped surfaces having suitable protrusion structures are disposed on the sides of the second pixel define layer 202 facing a set of long sides of the second hollow 102, and the printed ink droplets are at a position that the protrusion structures in the second pixel define layer are directly opposite to each other, a resultant force of the interfacial tensions of the ink droplets and the second pixel define layer points to the outside of the pixel, so that a flatness of the functional light emitting layer along the short side can be increased. For a set of short sides, the protrusion structure may not be provided, so that a resultant force of the interfacial tensions of the ink droplets in this direction is zero, and no additional inward or outward traction force is generated.

Based on this, taking into account the actual arrangement of the sub-pixels, for the case where the above-mentioned protrusion structures are directly opposite to each other along a set of opposite sides, as shown in FIG. 9, adjacent sub-pixel light emitting areas P can be displaced in a row direction. That is, protrusion change trends of adjacent sides of the second pixel define layer facing adjacent two second hollows are opposite to each other, so that a width of the second pixel define layer between adjacent sub-pixel light emitting areas P is substantially the same. Therefore, color mixing between inks in adjacent sub-pixel light emitting areas P is avoided.

FIG. 9 merely gives schematic illustrations by taking three sub-pixel light emitting areas of red (R), green (G) and blue (B) on the array substrate as examples. In the array substrate shown in FIG. 9, a pixel circuit and the sub-pixel light-emitting areas do not overlap (that is, the projections of the pixel circuit and the sub-pixel light-emitting areas on the base substrate do not overlap). In this embodiment, the array substrate may be of a bottom emission type. In another embodiment, the array substrate may also be of a top emission type, and the pixel circuit is disposed opposite to the sub-pixel light emitting area on a back surface of the base substrate (that is, the projections of the pixel circuit and the sub-pixel light-emitting areas on the base substrate overlap). The present disclosure is not limit thereto.

In addition, in one or more embodiments, the protrusion structures 300 located on sides of the second pixel define layer 202 facing a set of opposite sides of the second hollow 102 can also be dislocated so that a surface tension of the ink droplets in the hollow can be dispersed, and the present disclosure is not specifically limited thereto.

An embodiment of the present disclosure further provides a display device including the aforementioned array substrate, the display device having the same advantageous effects as the array substrate provided by the foregoing embodiments. Since the foregoing embodiments have described the structure and advantageous effects of the array substrate in details, no more details will be given here.

It should be noted that in the embodiments of the present disclosure, the display device may be any product or component with a display function such as electronic paper, OLED panel, mobile phone, tablet computer, television, monitor, notebook computer, digital photo frame, navigator, or the like.

An embodiment of the present disclosure further provides a method for manufacturing an array substrate, as shown in FIG. 10, the manufacturing method includes:

step S101, forming a define thin film layer on a base substrate, and forming a hollow at a position of the define thin film layer corresponding to a sub-pixel light emitting area through a patterning process, and forming protrusion structures on sides of the define thin film layer facing the hollow to form a pixel define layer of the array substrate.

It should be understood here that the above-mentioned base substrate does not absolutely mean a single base substrate. Before the define thin film layer is formed, gate lines, data lines, pixel circuit arrays, electrodes, and other devices are also formed on the base substrate, which are not described here one by one.

Specifically, the specific processes of step S101 according to one or more embodiments are schematically provided below.

The step may include: firstly forming a first define thin film layer and a second define thin film layer sequentially on a base substrate including gate lines, data lines, pixel circuit arrays, electrodes, and other devices, wherein the first define thin film layer has a small thickness and has lyophilicity, and it is generally formed using materials such as silicon dioxide and silicon oxynitride; a first surface of the side of the second define film layer facing away from the base substrate has lyophobicity, and a second surface extending from the first surface toward a side of the base substrate has lyophilicity.

Then, referring to FIG. 7 and FIG. 8, through patterning process (which may be twice), a first hollow is formed at a position of the first define thin film layer corresponding to the sub-pixel light emitting area (i.e., forming a first pixel define layer 201), a second hollow is formed at a position of the second define thin film layer corresponding to the sub-pixel light emitting area, and at the same time, a protrusion structure is formed on the side facing the second hollow (i.e., forming the second pixel define layer 202). The second hollow 102 in the second define thin film layer (the second pixel define layer 202) exposes a portion of the first define thin film layer (the first pixel define layer 201) that is around an edge of the first hollow 101.

The first pixel define layer 201 and the second pixel define layer 202 together form the pixel define layer 200 of the array substrate.

Step S102, a light emitting functional layer is formed by inkjet printing within the hollow and on the substrate on which the pixel define layer is formed.

Specifically, ink that forms the light emitting functional layer is printed in the hollow (the first hollow and the second hollow) by inkjet printing, and is dried by a drying process to form a light emitting functional layer.

In summary, the present disclosure adopts an inkjet printing process to form a light emitting functional layer in the hollow, in which case the protrusion structures on sides facing the hollow can adjust a surface tension of the ink printed in the hollow area. That is, according to the actual requirements, the surface tension of the ink in the sub-pixel light emitting area can be redistributed by providing protrusion structures on the sides facing the hollow, so that a purpose of adjusting distribution of stress of solute migration during a thin film drying process within the sub-pixel light emitting area can be achieved. Then, a film uniformity of an organic light emitting film layer is improved by a reasonably optimized drying process.

It should be noted here that the patterning process in the present disclosure may include a photolithography process and an etching step, and may also include other processes for forming a predetermined pattern such as printing, inkjet, and the like. The lithography process refers to a process of forming a pattern by using a photoresist, a mask plate, an exposure machine, or the like, including film formation, exposure, and development processes. A corresponding patterning process may be selected according to the structure formed in the present disclosure.

In addition, related configurations and corresponding effects in the method embodiments have been described in details with respect to the foregoing array substrate structure, and specific reference may be made to corresponding descriptions of the array substrate structure in the foregoing, which will not be described herein.

The above are only embodiments disclosed by the present disclosure, but the protection scope of the present disclosure shall not be limited thereto. Any modification or substitution conceivable to those technicians familiar with the present technical field within the technical scope disclosed by the present disclosure shall be included in the protection scope of the present disclosure. Therefore, the protection scope of the present disclosure shall be dependent on the protection scope of the claims.

What is claimed is:

1. An array substrate, comprising:
a pixel define layer located on a base substrate, the pixel define layer having a hollow for defining a sub-pixel light emitting area, and
a light emitting functional layer located within the hollow,
the pixel define layer includes stacked a first pixel define layer and a second pixel define layer, the second pixel define layer being located on a side of the first pixel define layer facing away from the base substrate;
the first pixel define layer has lyophilicity, a first surface of the second pixel define layer that faces away from the base substrate has lyophobicity, and a second surface of the second pixel define layer that extends from the first surface toward the base substrate has lyophilicity;
the hollow includes a first hollow located in the first pixel define layer and a second hollow located in the second pixel define layer, and the second hollow exposes a portion of the first pixel define layer that is around an edge of the first hollow;
the first hollow and the second hollow both have two opposite long sides and two opposite short sides;
each of two sides of the second pixel define layer facing the two opposite long sides of the second hollow has more than two protrusion structures; and
two sides of the second pixel define layer facing the two opposite short sides of the second hollow are substantial flat.

2. The array substrate according to claim 1, wherein the protrusion structures are disposed opposite to each other.

3. The array substrate according to claim 1, wherein the one or more sides of the pixel define layer having the protrusion structure are polygonal surfaces or arc-shaped surfaces.

4. The array substrate according to claim 1, wherein the light emitting functional layer is formed by inkjet printing.

5. A display device, comprising an array substrate, the array substrate including:
a pixel define layer on a base substrate, the pixel define layer having a hollow for defining a sub-pixel light emitting area, and
a light emitting functional layer located within the hollow,
the pixel define layer includes stacked a first pixel define layer and a second pixel define layer, the second pixel define layer being located on a side of the first pixel define layer facing away from the base substrate; and
the first pixel define layer has lyophilicity, a first surface of the second pixel define layer that faces away from the base substrate has lyophobicity, and a second surface of the second pixel define layer that extends from the first surface toward the base substrate has lyophilicity;
the hollow includes a first hollow located in the first pixel define layer and a second hollow located in the second pixel define layer, and the second hollow exposes a portion of the first pixel define layer that is around an edge of the first hollow;
the first hollow and the second hollow both have two opposite long sides and two opposite short sides;

each of two sides of the second pixel define layer facing the two opposite long sides of the second hollow has more than two protrusion structures; and two sides of the second pixel define layer facing the two opposite short sides of the second hollow are substantial flat.

6. The display device according to claim 5, wherein the protrusion structures are disposed opposite to each other.

7. The display device according to claim 5, wherein the one or more sides of the pixel define layer having the protrusion structure are polygonal surfaces or arc-shaped surfaces.

8. The display device according to claim 5, wherein the light emitting functional layer is formed by inkjet printing.

9. An array substrate, comprising:

a pixel define layer located on a base substrate, the pixel define layer having a hollow for defining a sub-pixel light emitting area, and a light emitting functional layer located within the hollow, wherein the hollow has two opposite long sides and two opposite short sides;

each of two sides of the pixel define layer facing the two opposite long sides of the hollow has more than two protrusion structures; and two sides of the pixel define layer facing the two opposite short sides of the hollow are substantial flat.

\* \* \* \* \*